United States Patent
Tian et al.

(10) Patent No.: US 12,218,673 B2
(45) Date of Patent: Feb. 4, 2025

(54) COMPARATOR CIRCUIT, METHOD FOR CORRECTING MISMATCH AND MEMORY

(71) Applicant: CHANGXIN MEMORY TECHNOLOGIES, INC., Hefei (CN)

(72) Inventors: Kai Tian, Hefei (CN); Ling Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 21 days.

(21) Appl. No.: 17/822,775

(22) Filed: Aug. 27, 2022

(65) Prior Publication Data

US 2023/0327656 A1  Oct. 12, 2023

Related U.S. Application Data

(63) Continuation of application No. PCT/CN2022/093571, filed on May 18, 2022.

(30) Foreign Application Priority Data

Mar. 23, 2022 (CN) .......................... 202210294447.9

(51) Int. Cl.
| | | |
|---|---|---|
| G11C 21/00 | (2006.01) | |
| G11C 11/4093 | (2006.01) | |
| H03K 5/24 | (2006.01) | |

(52) U.S. Cl.
CPC .......... *H03K 5/249* (2013.01); *G11C 11/4093* (2013.01)

(58) Field of Classification Search
CPC ............................ G11C 11/4093; H03K 5/249
See application file for complete search history.

(56) References Cited

U.S. PATENT DOCUMENTS

| | | | |
|---|---|---|---|
| 4,464,631 A | 8/1984 | Prentice | |
| 5,045,806 A * | 9/1991 | Yan | H03F 3/45479 330/252 |
| 6,388,521 B1 * | 5/2002 | Henry | H03F 3/45766 327/307 |
| 7,109,697 B1 | 9/2006 | Atrash et al. | |
| (Continued) | | | |

FOREIGN PATENT DOCUMENTS

| | | |
|---|---|---|
| CN | 106788352 A | 5/2017 |
| KR | 20000004448 A | 1/2000 |
| WO | 2012168989 A1 | 12/2012 |

OTHER PUBLICATIONS

CN first office action in Application No. 202210294447.9, mailed on Dec. 20, 2024.

*Primary Examiner* — Min Huang
(74) *Attorney, Agent, or Firm* — Syncoda LLC; Feng Ma

(57) ABSTRACT

A comparator circuit includes a first transistor, a second transistor, a load circuit, a first adjustment circuit and a second adjustment circuit. A terminal of the first transistor is coupled to a first node, another terminal of the first transistor is coupled to a first control node, and a gate of the first transistor is configured to receive a first control signal. A terminal of the second transistor is coupled to the first node, another terminal of the second transistor is coupled to a second control node, and a gate of the second transistor is configured to receive a second control signal. A terminal of the load circuit is coupled to a second node, and another terminal of the load circuit is coupled to the first control node and the second control node.

18 Claims, 9 Drawing Sheets

(56) References Cited

U.S. PATENT DOCUMENTS

2008/0143637 A1\* 6/2008 Sunahara ............. G06F 3/1446
  345/1.1
2011/0037507 A1 2/2011 Hwang
2014/0314171 A1 10/2014 Hekmat et al.

\* cited by examiner

COMPARATOR CIRCUIT, METHOD FOR CORRECTING MISMATCH AND MEMORY

CROSS-REFERENCE TO RELATED APPLICATIONS

The present disclosure is a US continuation application of International Application No. PCT/CN2022/093571 filed on May 18, 2022, which claims priority to Chinese patent application No. 202210294447.9 filed on Mar. 23, 2022. The disclosures of the above-referenced applications are hereby incorporated by reference in their entirety.

BACKGROUND

An input circuit of a memory generally adopts a differential input structure. Although the two input transistors of the differential input structure are of the same size in the design (including parameters such as aspect ratio and threshold voltage), in a process of forming the input transistors on an actual Silicon, a mismatch between the two input transistors will be caused by various factors (for example, the dose of doping ion implantation in the process, the angle of exposure, the position of the transistors, etc.).

Generally speaking, the mismatch caused by the above reasons is very small. However, the operating frequency of the memory is very high under normal operation conditions. In a situation that the signal frequency of the memory is very high (for example, the operating frequency of LPDDR4 can be 4266 MHz, and the operating frequency of LPDDR5 can even be 8533 MHZ), there will be a significant impact on the performance of the product even if there is a small mismatch between the input transistors. The impact of the above mismatch cannot be eliminated by traditional methods (such as increasing the size of the differential input transistors).

SUMMARY

The present disclosure relates to, but is not limited to, a comparator circuit, a method for correcting mismatch and a memory.

The embodiments of the present disclosure provide a comparator circuit. The comparator circuit includes a first transistor, a second transistor, a load circuit, a first adjustment circuit and a second adjustment circuit. A terminal of the first transistor is coupled to a first node, another terminal of the first transistor is coupled to a first control node, and a gate of the first transistor is configured to receive a first control signal. A terminal of the second transistor is coupled to the first node, another terminal of the second transistor is coupled to a second control node, and a gate of the second transistor is configured to receive a second control signal. A transistor doping type of the first transistor is the same with a transistor doping type of the second transistor. A terminal of the load circuit is coupled to a second node, and another terminal of the load circuit is coupled to the first control node and the second control node. The load circuit is configured to adjust a level of the second control node based on a level of the first control node, or adjust the level of the first control node based on the level of the second control node. The adjusted node in the first control node and the second control node is configured to output an output signal. One of the first node and the second node is configured to receive a high level, and the other of the first node and the second node is configured to receive a low level. A terminal of the first adjustment circuit is coupled to the first node, and another terminal of the first adjustment circuit is coupled to the first control node. The first adjustment circuit is configured to adjust, according to a first adjustment signal, a node potential of the first control node after the first transistor becomes conductive based on the first control signal. A terminal of the second adjustment circuit is coupled to the first node, and another terminal of the second adjustment circuit is coupled to the second control node. The second adjustment circuit is configured to adjust, according to a second adjustment signal, a node potential of the second control node after the second transistor becomes conductive based on the second control signal. The first adjustment signal and the second adjustment signal are configured to adjust a mismatch between the first transistor and the second transistor.

The embodiments of the present disclosure provide a method for correcting mismatch, which is applicable for the above comparator circuit. The method includes the following operations. Inputs of a first control signal and a second control signal are controlled to be the same during a calibration phase. A first adjustment signal is initially set to a maximum value and a second adjustment signal is initially set to a minimum value. The first adjustment signal is gradually decreased and the second adjustment signal is gradually increased. An output signal corresponding to different first adjustment signals and second adjustment signals is obtained. A first adjustment signal and a second adjustment signal that correspond to a first time point at which a potential inversion of the output signal occurs are obtained. The first adjustment signal and the second adjustment signal that correspond to the first time point are taken as a first adjustment signal and a second adjustment signal that are required to be provided in a working phase.

The embodiments of the present disclosure provide a memory. The comparator circuit provided in the above embodiment is used by the memory for data input.

BRIEF DESCRIPTION OF THE DRAWINGS

One or more embodiments are described exemplarily by the pictures in the corresponding accompanying drawings. These exemplary descriptions do not constitute limitations on the embodiments. Unless otherwise stated, the drawings in the accompanying drawings do not constitute a scale limitation. In order to more clearly illustrate the technical solutions in the embodiments of the present disclosure or in the traditional technology, the accompanying drawings required in the embodiments will be briefly introduced below. Obviously, the drawings in the following description are only some embodiments of the present disclosure. Those skilled in the art can obtain other drawings according to these drawings without creative efforts.

DETAILED DESCRIPTION

Although the two input transistors of the differential structure are of the same size in design, in a process of forming the input transistors on an actual Silicon, a mismatch between the two input transistors will be caused by various factors.

The mismatch caused by the above reasons is very small. However, the operating frequency of the memory is very high under normal operation conditions. In a situation that the signal frequency of the memory is very high, there will be a significant impact on the performance of the product even if there is a small mismatch between the input transistors.

Embodiments of the present disclosure provide a comparator circuit to eliminate the mismatch between two input transistors of a differential structure, thereby improving memory performance.

It can be understood by those skilled in the art that, in the various embodiments of the present disclosure, many technical details are provided for the reader to better understand the present disclosure. However, even without these technical details and various changes and modifications based on the following embodiments, the technical solutions claimed in the present disclosure can be implemented. The following divisions of the various embodiments are for the convenience of description, and should not constitute any limitation on the specific embodiments of the present disclosure. The various embodiments may be combined with each other and referred to each other under the premise of not contradicting each other.

Figure 1:
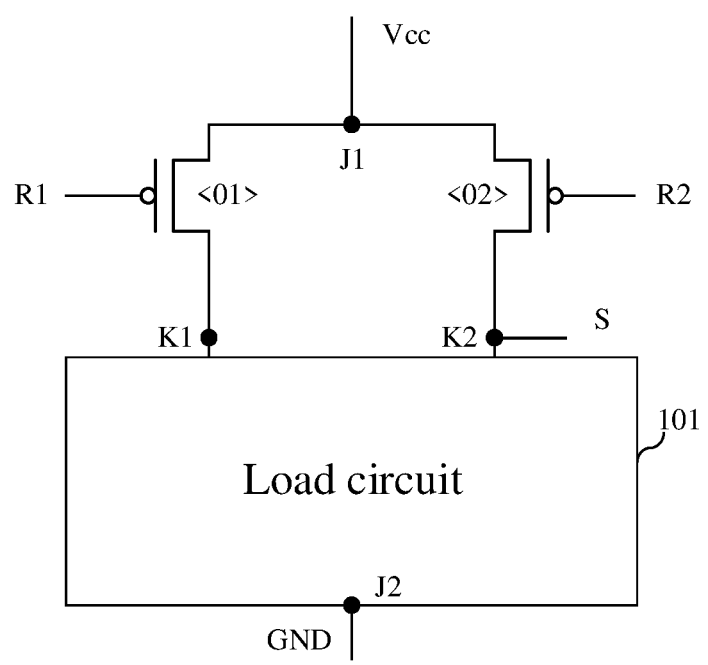
FIG. 1 is a first schematic diagram of two structures of a comparator circuit according some embodiments of the present disclosure.
Figure 2:
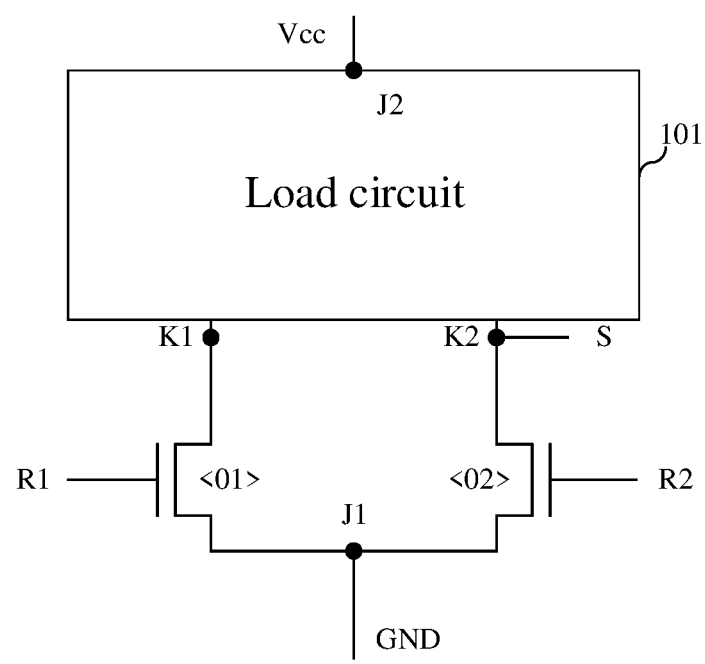
FIG. 2 is a second schematic diagram of two structures of a comparator circuit according some embodiments of the present disclosure.
Figure 3:
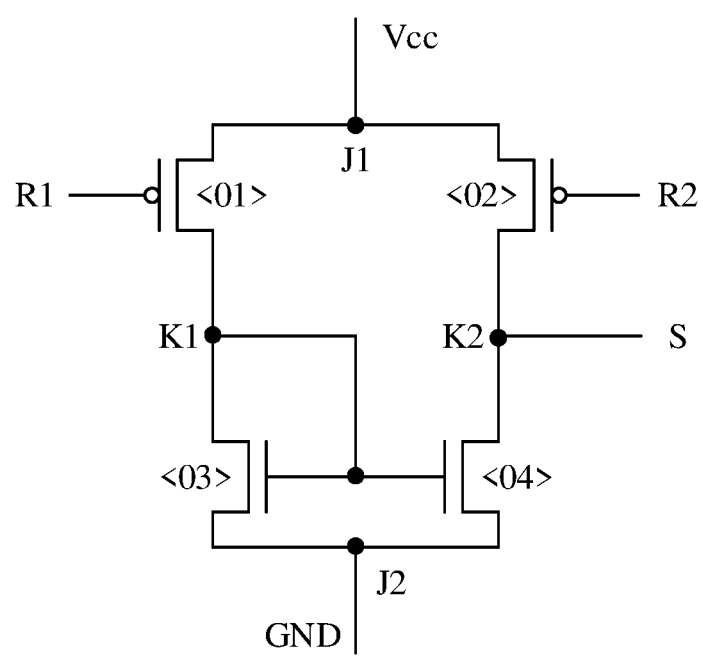
FIG. 3 is a first schematic diagram of two structures of a comparator circuit with load according to some embodiments of the present disclosure.
Figure 4:
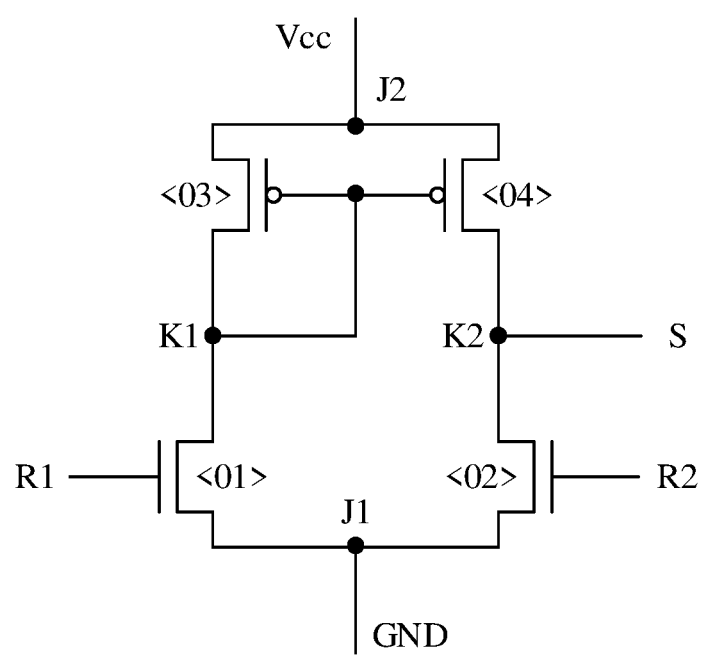
FIG. 4 is a second schematic diagram of two structures of a comparator circuit with load according to some embodiments of the present disclosure.
Figure 5:
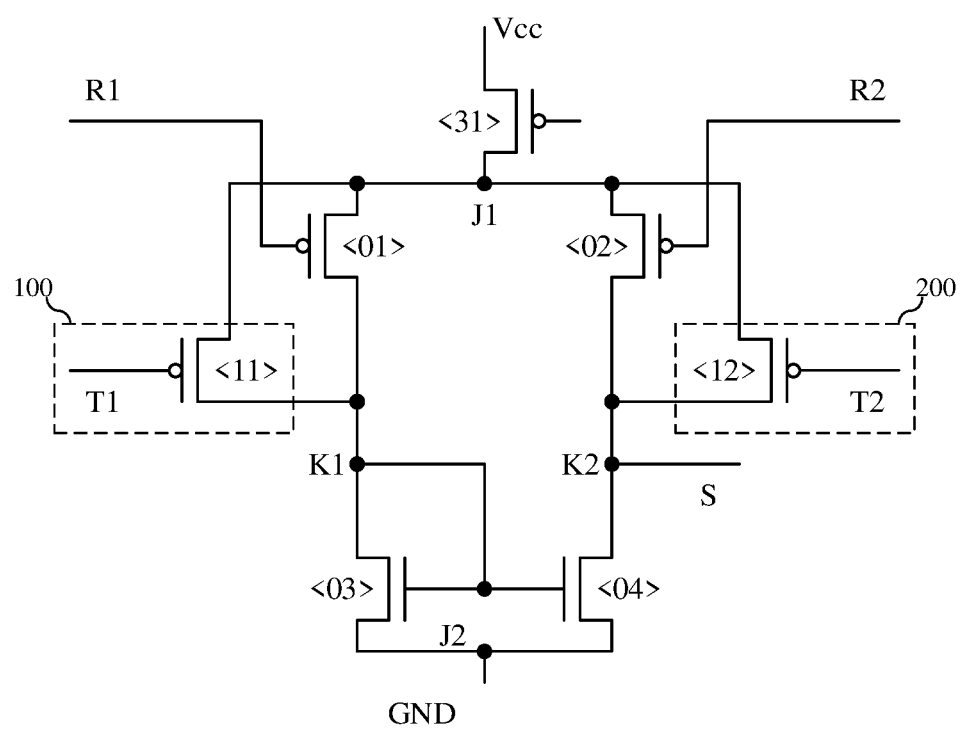
FIG. 5 is a schematic structural diagram of a first adjustment circuit, a second adjustment circuit, and a switch MOS transistor according to some embodiments of the present disclosure.
Figure 6:
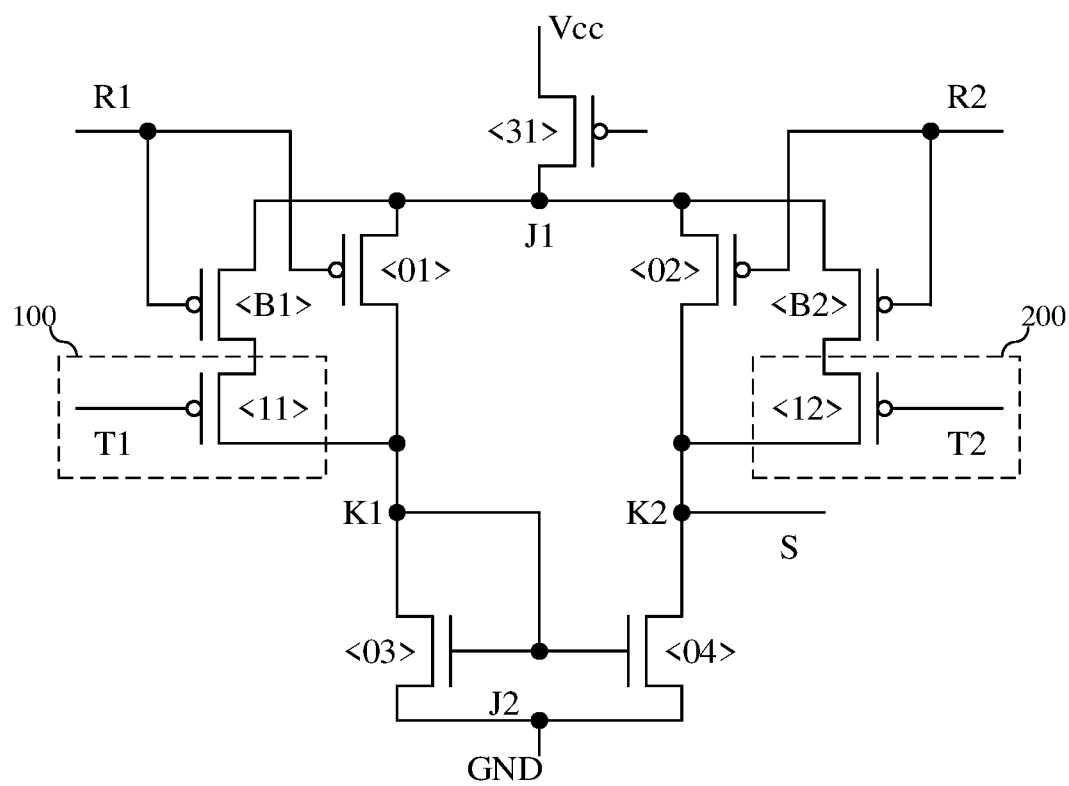
FIG. 6 is a schematic structural diagram of a first adjustment circuit and a second adjustment circuit that are provided with protection transistors according to some embodiments of the present disclosure.
Figure 7:
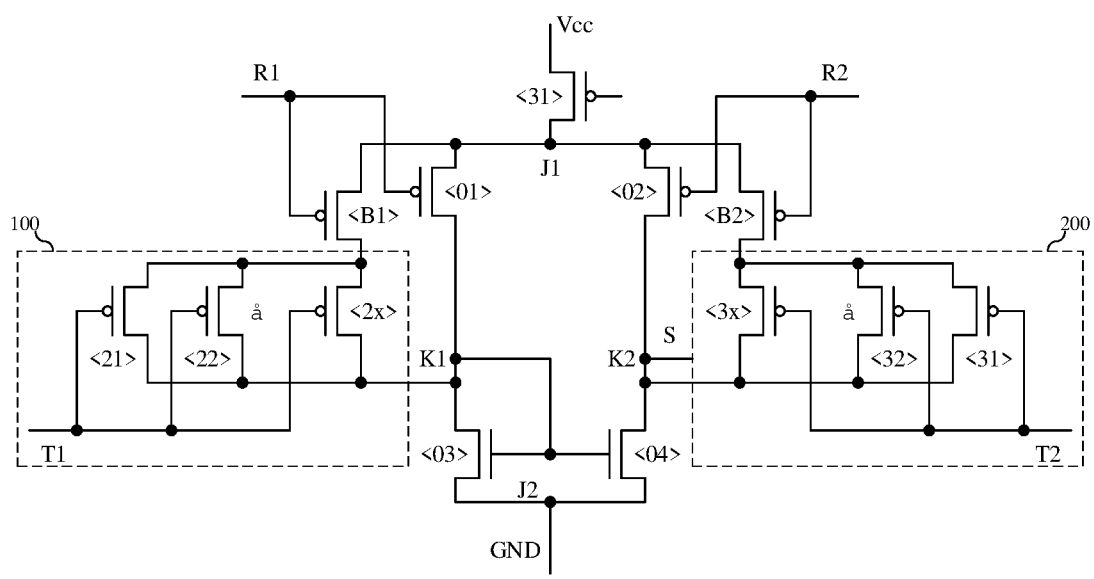
FIG. 7 is a schematic structural diagram of another first adjustment circuit and second adjustment circuit that are provided with protection transistors according to some embodiments of the present disclosure.
Figure 8:
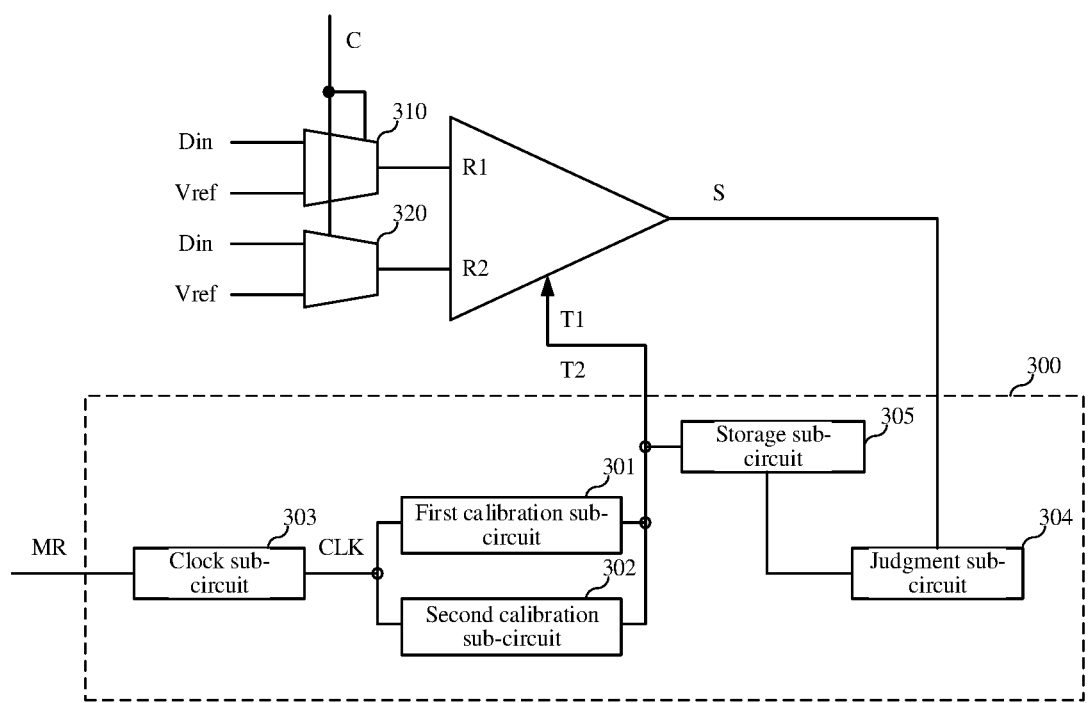
FIG. 8 is a schematic structural diagram of a calibration control circuit according to some embodiments of the present disclosure.

FIG. 1 and FIG. 2 are schematic diagrams of two structures of a comparator circuit according some embodiments of the present disclosure. FIG. 3 and FIG. 4 are schematic diagrams of two structures of a comparator circuit with load according to some embodiments of the present disclosure. FIG. 5 is a schematic structural diagram of a first adjustment circuit, a second adjustment circuit, and a switch MOS transistor according to some embodiments of the present disclosure. FIG. 6 is a schematic structural diagram of a first adjustment circuit and a second adjustment circuit that are provided with protection transistors according to some embodiments of the present disclosure. FIG. 7 is a schematic structural diagram of another first adjustment circuit and another second adjustment circuit that are provided with protection transistors according to some embodiments of the present disclosure. FIG. 8 is a schematic structural diagram of a calibration control circuit according to some embodiments of the present disclosure. The comparator circuit provided in the embodiments is described below with reference to the accompanying drawings.

Referring to FIG. 1 to FIG. 7, the comparator circuit includes a first transistor <01>, a second transistor <02> and a load circuit 101.

A terminal of the first transistor <01> is coupled to a first node J1, another terminal of the first transistor <01> is coupled to a first control node K1, and a gate of the first transistor <01> is configured to receive a first control signal R1.

A terminal of the second transistor <02> is coupled to the first node J1, another terminal of the second transistor <02> is coupled to a second control node K2, and a gate of the second transistor <02> is configured to receive a second control signal R2.

A transistor doping type of the first transistor <01> is the same with a transistor doping type of the second transistor <02>. That is, the first transistor <01> and the second transistor <02> are taken as two input transistors of a differential structure, and the first control signal R1 and the second control signal R2 are taken as differential input data of the differential structure.

A terminal of the load circuit 101 is coupled to the second node J2, and the other terminal of the load circuit 101 is coupled to the first control node K1 and the second control node K2. The load circuit 101 is configured to adjust a level of the second control node K1 based on a level of the first control node K1, or adjust the level of the first control node K1 based on the level of the second control node K2. The adjusted node in the first control node K1 and the second control node K2 is configured to output an output signal S.

The output signal S is the output signal of the differential structure.

One of the first node J1 and the second node J2 is configured to receive a high level, and the other of the first node J1 and the second node J2 is configured to receive a low level.

In some embodiments, when the first node J1 receives a high level and the second node J2 receives a low level, the schematic diagram of the structure of the comparator circuit may be referred to FIG. 1. When the first node J1 receives a low level and the second node J2 receives a high level, the schematic diagram of the structure of the comparator circuit may be referred to FIG. 2.

It should be noted that the embodiment is described in detail by taking the load circuit 101 controlling the level of the second control node K2 based on the level of the first control node K1 as an example, which does not constitute a limitation to the embodiment. In other embodiments, those skilled in the art can replace the positions of the first control node and the second control node, so as to implement a solution in which the load circuit controls the level of the first control node based on the level of the second control node.

It should be noted that the above mentioned "high level" is a level provided by an internal power supply Vcc of the memory to which the comparator circuit belongs, and the above mentioned "low level" is a level provided by the ground node GND of the comparator circuit.

Referring to FIG. 3 and FIG. 4, for the load circuit 101 shown in FIG. 1 and FIG. 2, the load circuit 101 includes a third transistor <03> and a fourth transistor <04>.

A terminal of the third transistor <03> is coupled to the second node J2, and another terminal of the third transistor <03> is coupled to the first control node K1.

A terminal of the fourth transistor <04> is coupled to the second node J2, and another terminal of the fourth transistor <04> is coupled to the second control node K2.

A gate of the third transistor <03> is coupled to a gate of the fourth transistor <04>, and is coupled to the first control node K1. A transistor doping type of the third transistor <03> is the same with a transistor doping type of the fourth transistor <04>, and the transistor doping type of the first transistor <01> is different from the transistor doping type of the third transistor <03>.

It should be noted that, FIG. 3 corresponds to the structure of the comparator circuit in FIG. 1 in which the first node J1 receives the high level and the second node J2 receives a low level. At this time, the first transistor <01> and the second transistor <02> are PMOS transistors, and the third transistor <03> and the fourth transistor <04> are NMOS transistors. FIG. 4 corresponds to the structure of the comparator circuit in FIG. 2 in which the first node J1 receives the low level and the second node J2 receives a high level. At this time, the first transistor <01> and the second transistor <02> are NMOS transistors, and the third transistor <03> and the fourth transistor <04> are PMOS transistors.

Further, referring to FIG. 5, in the circuit shown in FIG. 5, the first node J1 is configured to couple a power supply node Vcc, and the second node J2 is configured to couple a ground node GND, so as to achieve that the first node J1 receives a high level, and the second node J2 receives a low level. Accordingly, in some embodiments, the first node J1 is configured to couple the ground node GND, and the second node J2 is configured to couple the power supply node Vcc, so as to achieve that the first node J1 receives a low level, and the second node J2 receives a high level.

In addition, the above example only provides a kind of the structure of the load circuit 101. In other embodiments, the load circuit may also be formed in other load forms.

It should be noted that, in the embodiments of the present disclosure, the following circuit description is performed by taking the diagram that the first node J1 is configured to couple the power supply node Vcc and the second node J2 is configured to couple the ground node GND as an example, which does not constitute a limitation to the embodiments.

Referring to FIG. 5 continuously, the comparator circuit also includes a first adjustment circuit 100 and a second adjustment circuit 200.

A terminal of the first adjustment circuit 100 is coupled to the first node J1, and another terminal of the first adjustment circuit 100 is coupled to the first control node K1. The first adjustment circuit 100 is configured to adjust, according to a first adjustment signal T1, a node potential of the first control node K1, after the first transistor <01> becomes conductive based on the first control signal R1.

A terminal of the second adjustment circuit 200 is coupled to the first node J1, and another terminal of the second adjustment circuit 200 is coupled to the second control node K2. The second adjustment circuit 200 is configured to adjust, according to a second adjustment signal T2, a node potential of the second control node K2, after the second transistor <02> becomes conductive based on the second control signal R2.

The first adjustment signal T1 and the second adjustment signal T2 are configured to adjust a mismatch between the first transistor <01> and the second transistor <02>.

It should be noted that the above "mismatch" represents that in a process of forming the input transistors, a parameter mismatch between the two input transistors will be caused by various factors (for example, the dose of doping ion implantation in the process, the angle of exposure, the position of the transistors, etc.).

In some embodiments, the first transistor <01> and the second transistor <02> are taken as two input transistors of a differential structure. When there is no mismatch between the first transistor <01> and the second transistor <02>, after the first transistor <01> and the second transistor <02> become conductive, the first control node K1 and the first node J1 are indirectly connected, the current flows from the first node J1 to the first control node K1 through the first transistor <01>, the second control node K2 and the first node J1 are indirectly connected, and the current flows from the first node J1 to the second control node K2 through the second transistor <02>. At this time, when the first control signal R1 is equal to the second control signal R2, the potential of the first control node K1 is the same with the potential of the second control node K2. When there is a mismatch between the first transistor <01> and the second transistor <02>, there is a difference between the activation degrees of the first transistor <01> and the second transistor <02> based on a same gate activation voltage, which causes the potential difference between the first control node K1 and the second control node K2, thereby affecting the output of the differential structure.

In the embodiment of the present disclosure, the first adjustment circuit 100 is connected in parallel with the first transistor <01>, and the first adjustment circuit 100 may be conductive based on the first adjustment signal T1. After the first adjustment circuit 100 becomes conductive, the first node J1 is connected to the first control node K1 through the first adjustment circuit 100, thus the potential of the first control node K1 is adjusted. The second adjustment circuit 200 is connected in parallel with the second transistor <02>, and the second adjustment circuit 200 becomes conductive based on the second adjustment signal T2. After the second adjustment circuit 200 becomes conductive, the first node J1 is connected to the second control node K2 through the second adjustment circuit 200, thus the potential of the second control node K2 is adjusted. The first adjustment signal T1 and the second adjustment signal T2 are adjusted, so that when the first control signal R1 is the same with the second control signal R2, the node potential of the first control node K1 is the same with the node potential of the second control node K2. That is, the mismatch between the first transistor <01> and the second transistor <02> is corrected through the first adjustment circuit 100 and the second adjustment circuit 200.

In some embodiments, when the first control signal R1 is the same with the second control signal R2, the first adjustment signal T1 and the second adjustment signal T2 corresponding to a time point at which an potential inversion of the output signal S occurs are taken as the correction signals of the first adjustment circuit 100 and the second adjustment circuit 200.

Referring to FIG. 5 to FIG. 7, the comparator circuit further includes a switch MOS transistor <31>.

A terminal of the switch MOS transistor <31> is coupled to the power supply node Vcc or the ground node GND, another terminal of the switch MOS transistor <31> is coupled to the first node J1, and a gate of the switch MOS transistor <31> is configured to receive a switch enable signal.

The switch MOS transistor <31> is coupled to the power supply node Vcc in response to the first node J1 being configured to receive the high level, and the switch MOS transistor <31> is coupled to the ground node GND in response to the first node J1 being configured to receive the low level.

In addition, a doping type of the switch MOS transistor <31> is the same with a doping type of the first transistor <01>.

The switch enable signal is configured to conduct the switch MOS transistor <31>. The switch MOS transistor <31> becomes conductive based on the switch enable signal to provide current to the comparator circuit, thereby activating the comparator circuit, so that the comparator circuit is activated when in use and is inactivated when not in use, and thus the energy is saved. In addition, the situation that the transistors in the corresponding comparator circuit are broken down due to the direct loading of the level on the comparator circuit can be reduced by the switch MOS transistor <31>.

It should be noted that, in the embodiment, the switch MOS transistor is taken as the connection component between the first node J1 and the power supply node Vcc or ground node GND. In some embodiments, a current source can be set to replace the switch MOS transistor to be taken as the connection component between the first node J1 and the power supply node Vcc.

The circuits shown in FIG. 5 to FIG. 7 take the first node J1 receiving a high level as an example. At this time, the switch MOS transistor <31> and the first transistor <01> are PMOS transistors, and a terminal of the switch MOS transistor <31> is configured to couple the power supply node Vcc. If the comparator circuit uses the first node J1 to receive a low level, the reference is made to FIG. 2 and FIG. 4 accordingly, at this time, the switch MOS transistor and the first transistor <01> are NMOS transistors, and a terminal of the switch MOS transistor <31> is configured to couple the ground node GND.

It should be noted that the "coupling" mentioned in the above embodiments includes direct connection and indirect connection. The direct connection represents direct connection of wire, and indirect connection represents indirect electrical connection through other semiconductor devices. In the embodiment, the semiconductor device in the indirect connection is not limited. As long as it conforms to the connection relationship embodied in the above embodiments, it should fall within the protection scope of the present disclosure.

In some embodiments, referring to FIG. 6 and FIG. 7, the comparator circuit further includes a first protection transistor <B1> and a second protection transistor <B2>.

A type of the first protection transistor <B1> is the same with a type of the first transistor <01>. A terminal of the first protection transistor <B1> is coupled to the first node J1, another terminal of the first protection transistor <B1> is coupled to the first adjustment circuit 100, and a gate of the first protection transistor <B1> is configured to receive the first control signal R1.

A type of the second protection transistor <B2> is the same with a type of the second transistor <02>, a terminal of the second protection transistor <B2> is coupled to the first node J1, another terminal of the second protection transistor <B2> is coupled to the second adjustment circuit 200, and a gate of the second protection transistor <B2> is configured to receive the second control signal R2.

The first protection transistor <B1> is connected in series with the first adjustment circuit 100, and becomes conductive based on the first control signal R1, so that when the first transistor <01> is operating, a branch where the first adjustment circuit 100 is located becomes conductive at the same time. In addition, the type of the first protection transistor <B1> is the same with the type of first transistor <01>. Those skilled in the art can understand that, for the first adjustment transistors of the same size, in the situation of the protection transistors connected in series, under the effect of the same adjustment signal, the adjustment capability of the transistor becomes weaker, and the adjustment effect on the current becomes more precise, thereby reducing the over-adjustment to the first control node K1 by the first adjustment circuit 100. The second protection transistor <B2> is connected in series with the second adjustment circuit 200, and becomes conductive based on the second control signal R2, so that when the second transistor <02> is operating, a branch where the second adjustment circuit 200 is located becomes conductive at the same time. In addition, the type of the second protection transistor <B2> is the same with the type of the second transistors <01>, thereby reducing the over-adjustment to the second control node K2 by the second adjustment circuit 200.

For the first adjustment circuit 100 and the second adjustment circuit 100, the embodiment provides two implementation strategies, as follows.

One implementation strategy is as follows.

The first circuit 100 includes a first adjustment transistor <11>. A terminal of the first adjustment transistor <11> is coupled to the first node J1, another terminal of the first adjustment transistor <11> is coupled to the first control node K1, and a gate of the first adjustment transistor <11> is configured to receive the first adjustment signal T1.

The first adjustment transistor <11> is configured to adjust a magnitude of a source-drain current based on the first adjustment signal T1.

The second adjustment circuit 200 includes a second adjustment transistor <12>. A terminal of the second adjustment transistor <12> is coupled to the first node J1, another terminal of the second adjustment transistor <12> is coupled to the second control node K2, and a gate of the second adjustment transistor <12> is configured to receive the second adjustment signal T2.

The second adjustment transistor <12> is configured to adjust a magnitude of a source-drain current based on the second adjustment signal T2.

In this implementation strategy, the conduction capability of the first adjustment transistor <11> may be changed by adjusting the magnitude of the first adjustment signal T1, thereby adjusting the potential influence of the first adjustment circuit 100 on the first control node K1. The conduction capability of the second adjustment transistor <12> may be changed by adjusting the magnitude of the second adjustment signal T2, thereby adjusting the potential influence of the second adjustment circuit 200 on the second control node K2.

In some embodiments, the source-drain conduction capabilities of the first adjustment transistor <11> and the second adjustment transistor <12> after being activated based on the same gate voltage are the same. In some embodiments, the same source-drain conduction capabilities of the first adjustment transistor and the second adjustment transistor after being activated based on the same gate voltage can be achieved by setting the same transistor size.

Referring to FIG. 6, the conduction degree of the first adjustment transistor <11> is controlled by inputting the magnitude of the first adjustment signal T1 of the first adjustment transistor <11>, thereby adjusting the magnitude of the current transmitted to the first control node K1 by the first node J1 through the first adjustment circuit 100, so as to change the potential influence on the first control node K1 through the first adjustment circuit 100. The conduction degree of the second adjustment transistor <12> is controlled by inputting the magnitude of the second adjustment signal T2 of the second adjustment transistor <12>, thereby adjusting the magnitude of the current transmitted to the second control node K2 by the first node J1 through the second adjustment circuit 200, so as to change the potential influence on the second control node K2 through the second adjustment circuit 100.

Another implementation strategy is as follows.

The first adjustment circuit 100 includes a first adjustment transistor group. The first adjustment transistor group includes x first adjustment transistors. A terminal of each of the x first adjustment transistors is coupled to the first node J1, another terminal of each of the x first adjustment transistors is coupled to the first control node K1, and a gate of each of the x first adjustment transistors is configured to receive the first adjustment signal T1, and the first adjustment signal T1 is configured to select to conduct the first adjustment transistors.

The second adjustment circuit 200 includes a second adjustment transistor group. The second adjustment transistor group includes x second adjustment transistors. A terminal of each of the x second adjustment transistors is coupled to the first node J1, another terminal of each of the x second adjustment transistors is coupled to the second control node K2, and a gate of each of the x second adjustment transistors is configured to receive the second adjustment signal T2, and the second adjustment signal is configured to select to conduct the second adjustment transistors.

Where, x is an integer greater than or equal to 2.

In this implementation strategy, the number of the first adjustment transistors in the first transistor group is controlled by adjusting the first adjustment signal T1 to change the conduction capability of the first adjustment transistor group, so as to adjust the potential influence of the first adjustment circuit 100 on the first control node K1. The number of the second adjustment transistors in the second transistor group is controlled by adjusting the second adjustment signal T2 to change the conduction capability of the second adjustment transistor group, so as to adjust the potential influence of the second adjustment circuit 200 on the second control node K2.

In some embodiments, source-drain conduction capabilities of the x first adjustment transistors after being activated based on a same gate voltage are the same, and source-drain conduction capabilities of the x second adjustment transistors after being activated based on a same gate voltage are the same. In some embodiments, different first adjustment transistors or second adjustment transistors may have the same source-drain conductance capabilities after being activated based on the same gate voltage by setting the same transistor size.

In some embodiments, among the x first adjustment transistors, after being activated based on a same gate voltage, a source-drain conduction capability of a nth first adjustment transistor is twice a source-drain conduction capability of a (n−1)th first adjustment transistor, and among the x second adjustment transistors, after being activated based on a same gate voltage, a source-drain conduction capability of a nth second adjustment transistor is twice a source-drain conduction capability of a (n−1)th second adjustment transistor. Herein, n is any integer less than or equal to x and greater than or equal to 2. In some embodiments, the source-drain conduction capabilities of the different first adjustment transistors or second adjustment transistors after being activated based on the same gate voltage can be changed in multiples by setting the transistor sizes to be changed in multiples.

Referring to FIG. 7, for the first transistor group, the source-drain conduction capability of the second one of first adjustment transistors <22> is twice the source-drain conduction capability of the first one of first adjustment transistors <21>, the source-drain conduction capability of the third one of first adjustment transistors <23> (not shown) is twice the source-drain conduction capability of the second one of first adjustment transistors <22> . . . the source-drain conduction capability of the xth one of first adjustment transistors <2x> is twice the source-drain conduction capability of the (x−1)th one of first adjustment transistor <2x−1> (not shown). For the second transistor group, the source-drain conduction capability of the second one of second adjustment transistors <32> is twice the source-drain conduction capability of the first one of second adjustment transistors <31>, the source-drain conduction capability of the third one of second adjustment transistors <33> (not shown) is twice the source-drain conduction capability of the second one of second adjustment transistors <32> . . . the source-drain conduction capability of the xth one of second adjustment transistors <3x> is twice the source-drain conduction capability of the (x−1)th one of second adjustment transistors <3x−1> (not shown).

The conduction of different first adjustment transistors in the first transistor group is controlled by adjusting the first adjustment signal T1, so that the overall source-drain conduction capability of the first transistor group is changed, thereby adjusting the potential influence of the first adjustment circuit 100 on the first control node K1. The conduction of different second adjustment transistors in the second transistor group is controlled by adjusting the second adjustment signal T2, so that the overall source-drain conduction capability of the second transistor group is changed, thereby adjusting the potential influence of the second adjustment circuit 200 on the second control node K2. It should be noted that in the example shown in FIG. 7, the first adjustment signal T1 and the second adjustment signal T2 are not a single signal, and the first adjustment signal T1 and the second adjustment signal T2 respectively represent a signal group, and each signal in the signal group is used to independently control the conduction of the corresponding transistors in the first transistor group and the second transistor group.

Referring to FIG. 8, in some embodiments, the comparator circuit further includes a calibration control circuit 300. The calibration control circuit 300 is configured to provide the first adjustment signal T1 and the second adjustment signal T2, thereby adjusting the mismatch between the first transistor <01 > and the second transistor <02>.

In some embodiments, the calibration control circuit 300 includes a clock sub-circuit 303, a first calibration sub-circuit 301, a judgment sub-circuit 304, and a storage sub-circuit 305.

The clock sub-circuit 303 is configured to receive a calibration enable signal MR, and generate a calibration clock CLK based on the calibration enable signal MR. The calibration enable signal MR is provided in a calibration phase.

The first calibration sub-circuit 301 is coupled to the clock sub-circuit 303, initially sets the first adjustment signal T1 to a maximum value and the second adjustment signal T2 to a minimum value, provides the first adjustment signal T1 and the second adjustment signal T2, and based on the calibration clock CLK, gradually decreases the first adjustment signal T1 and increases the second adjustment signal T2.

The judgment sub-circuit 304 is configured to receive an output signal S corresponding to different first adjustment signals T1 and second adjustment signals T2, and obtain a first adjustment signal T1 and a second adjustment signal T2 corresponding to a first time point t1 at which a potential inversion of the output signal S occurs.

The storage sub-circuit 305 is coupled to the judgment sub-circuit 304, is configured to obtain the first adjustment signal T1 and the second adjustment signal T2 corresponding to the first time point t1, and provide the first adjustment signal T1 and the second adjustment signal T2 corresponding to the first time point t1 in a working phase.

Referring to Table 1 below, the Table 1 is the first example of adjustment.

| Valid time of calibration clock CLK | 1 | 2 | 3 | 4 | 5 | 6 | Illustration |
|---|---|---|---|---|---|---|---|
| First adjustment signal T1 | A5 | A4 | A3 | A2 | A1 | A0 | The larger the number after A is, the larger the first adjustment signal T1 or the second adjustment signal T2 is |
| Second adjustment signal T2 | A0 | A1 | A2 | A3 | A4 | A5 | |
| Output signal | 0 | 0 | 0 | 1 | 1 | 1 | |
| Result | The time point at which a signal inversion of the output signal occurs is between 3-4. Either 3 or 4 may be taken as the first time point t1 | | | | | | |

Correspondingly, in some embodiments, the first calibration sub-circuit 301 is coupled to the clock sub-circuit 303, initially sets the first adjustment signal T1 to a minimum value and the second adjustment signal T2 to a maximum value, and provides the first adjustment signal T1 and the second adjustment signal T2, and based on the calibration clock CLK, gradually increases the first adjustment signal T1 and decreases the second adjustment signal T2.

At this time, the reference of the adjustment strategy is made to the following Table 2, which is the second example of adjustment.

| Valid time of calibration clock CLK | 1 | 2 | 3 | 4 | 5 | 6 | Illustration |
|---|---|---|---|---|---|---|---|
| First adjustment signal T1 | A0 | A1 | A2 | A3 | A4 | A5 | The larger the number after A is, the larger the first adjustment signal T1 or the second adjustment signal T2 is |
| Second adjustment signal T2 | A5 | A4 | A3 | A2 | A1 | A0 | |
| Output signal | 1 | 1 | 1 | 0 | 0 | 0 | |
| Result | The time point at which a signal inversion of the output signal occurs is between 3-4. Either 3 or 4 may be taken as the first time point t1 | | | | | | |

In some embodiments, the calibration control circuit 300 further includes a second calibration sub-circuit 302.

The second calibration sub-circuit 302 is coupled to the clock sub-circuit 303, initially sets the first adjustment signal T1 to the minimum value and the second adjustment signal T2 to the maximum value, provides the first adjustment signal T1 and the second adjustment signal T2, and based on the calibration clock CLK, gradually increases the first adjustment signal T1 and decreases the second adjustment signal T2.

The judgment sub-circuit 304 is further configured to obtain a first adjustment signal T1 and a second adjustment signal T2 corresponding to a second time point t2 at which a potential inversion of an output signal S occurs.

The storage sub-circuit 305 is further configured to obtain a first adjustment signal T1 and a second adjustment signal T2 corresponding to a second time point t2, take an average value of the first adjustment signals T1 corresponding to the first time point t1 and the second time point t2 as the first adjustment signal T1 required to be provided in the working phase, and take an average value of the second adjustment signals T2 corresponding to the first time point t1 and the second time point t2 as the second adjustment signal T2 required to be provided in the working phase.

Referring to the Table 3 blow, the Table 3 is the third example of adjustment.

| Valid time of calibration clock CLK | 1 | 2 | 3 | 4 | 5 | 6 | Illustration |
|---|---|---|---|---|---|---|---|
| First adjustment signal T1 | A5 | A4 | A3 | A2 | A1 | A0 | The larger the number after A is, the larger the first adjustment signal T1 or the second adjustment signal T2 is |
| Second adjustment signal T2 | A0 | A1 | A2 | A3 | A4 | A5 | |
| Output signal | 0 | 0 | 0 | 0 | 1 | 1 | |
| First adjustment signal T1 | A0 | A1 | A2 | A3 | A4 | A5 | |
| Second adjustment signal T2 | A5 | A4 | A3 | A2 | A1 | A0 | |
| Output signal | 1 | 1 | 1 | 0 | 0 | 0 | |
| Result | The time point at which a signal inversion of the output signal occurs is between 4-5. Either 4 or 5 may be taken as the first time point t1. The time point at which a signal inversion of the output signal occurs is between 3-4. Either 3 or 4 may be taken as the second time point t2. The first adjustment signal T1 is the average value of A1 and A3. The second adjustment signal T2 is the average value of A2 and A4 | | | | | | |

In some embodiments, the comparator circuit further includes a first selection circuit 310 and a second selection circuit 320.

The first selection circuit 310 receives an input selection signal C, and an input signal Din or a reference signal Vref, and is configured to provide the first control signal R1.

The second selection circuit 320 receives the input selection signal C, and the input signal Din or the reference signal Vref, and is configured to provide the first control signal R2.

The first selection circuit is configured to select, based on the input selection signal, the input signal or the reference signal to provide the first control signal.

The second selection circuit is configured to select, based on the input selection signal, the input signal or the reference signal to provide the second control signal.

The input signal Din is the actual input signal input to the shown comparator circuit, and the reference signal Vref is the reference signal used for judging whether the input is a high level or a low level.

In some embodiments, during the calibration phase, the input selection signal C is configured to control the first selection circuit 310 and the second selection circuit 320 to provide the first control signal R1 and the second control signal R2 simultaneously through the input signal Din, or provide the first control signal R1 and the second control signal R2 simultaneously through the reference signal Vref. That is, the first control signal R1 and the second control signal R2 are controlled to be a same signal to obtain the mismatch between the first transistor <01> and the second transistor <02>, so that the compensation for the mismatch between the first transistor <01> and the second transistor <02> is subsequently completed.

In the working phase, the input selection signal C is configured to control the first selection circuit 310 to provide the first control signal R1 through the input signal Din, and control the second selection circuit 320 to provide the second control signal R2 through the reference signal Vref. Optionally, in the working phase, the input selection signal C is configured to control the first selection circuit 310 to provide the first control signal R1 through the reference signal Vref, and control the second selection circuit 320 to provide the second control signal R2 through the input signal Din.

In the embodiment of the present disclosure, the first adjustment circuit 100 is connected in parallel with the first transistor <01>, and the first adjustment circuit 100 may be conductive based on the first adjustment signal T1. After the first adjustment circuit 100 becomes conductive, the first node J1 is connected to the first control node K1 through the first adjustment circuit 100, thus the potential of the first control node K1 is adjusted. The second adjustment circuit 200 is connected in parallel with the second transistor <02>, and the second adjustment circuit 200 may be conductive based on the second adjustment signal T2. After the second adjustment circuit 200 becomes conductive, the first node J1 is connected to the second control node K2 through the second adjustment circuit 200, thus the potential of the second control node K2 is adjusted. The first adjustment signal T1 and the second adjustment signal T2 are adjusted, which causes that when the first control signal R1 is the same with the second control signal R2, the node potential of the first control node K1 is the same with the node potential of the second control node K2. That is, the mismatch between the first transistor <01> and the second transistor <02> is corrected through the first adjustment circuit 100 and the second adjustment circuit 200.

All units involved in the embodiment are logical units. In practical applications, a logical unit may be a physical unit, a part of a physical unit, or a combination of multiple physical units. In addition, in order to highlight the innovative part of the present disclosure, the embodiment does not introduce units that are not closely related to solving the technical problems raised by the present disclosure, but this does not mean that there are no other units existed in this embodiment.

It should be noted that, the features disclosed in the comparator circuit provided by the above embodiments can be combined arbitrarily under the condition of no conflict, and a new comparator circuit embodiment may be obtained.

Another embodiment of the present disclosure provides a method for correcting mismatch, which applies the comparator circuit provided by the above embodiment to eliminate the mismatch between two input transistors of a differential structure, thereby improving memory performance.

Figure 9:
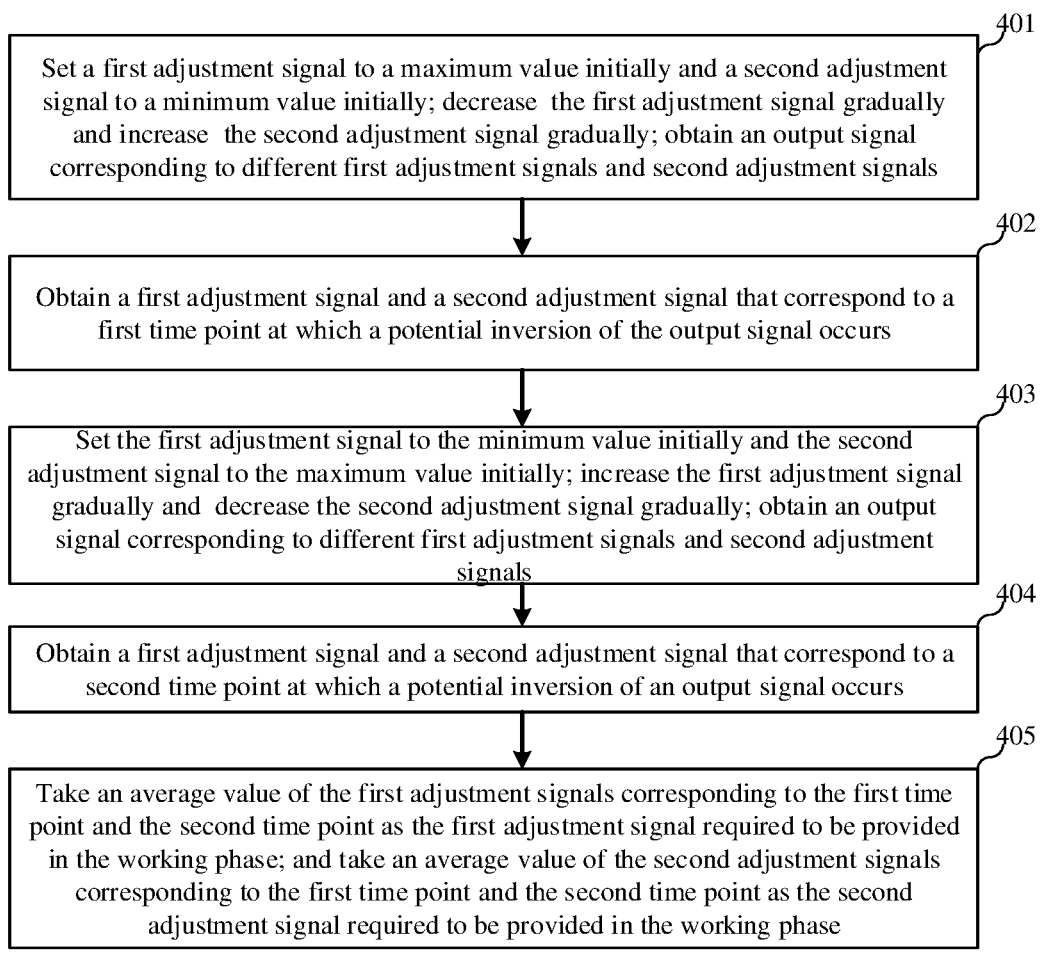
FIG. 9 is a schematic flowchart of a method for correcting mismatch according to some embodiments of the present disclosure.

FIG. 9 is a schematic flowchart of the method for correcting mismatch provided by the embodiment. The method for correcting mismatch provided by the embodiment is further described in detail below with reference to the accompanying drawings, as follows.

Referring to FIG. 9, the method for correcting mismatch includes the following steps.

In Step 401, a first adjustment signal is initially set to a maximum value and a second adjustment signal is initially set to a minimum value, the first adjustment signal is gradually decreased and the second adjustment signal is gradually increased, and an output signal corresponding to different first adjustment signals and second adjustment signals is obtained.

In Step 402, a first adjustment signal and a second adjustment signal that correspond to a first time point at which a potential inversion of the output signal occurs are obtained.

In some embodiments, inputs of the first control signal and the second control signal are controlled to be the same during a calibration phase. The first adjustment signal is initially set to a maximum value, and the second adjustment signal is initially set to a minimum value. The first adjustment signal is gradually decreased and the second adjustment signal is gradually increased. An output signal corresponding to different first adjustment signals and second adjustment signals is obtained. A first adjustment signal and a second adjustment signal that correspond to a first time point at which a potential inversion of the output signal occurs are obtained. The first adjustment signal and the second adjustment signal that correspond to the first time point are taken as a first adjustment signal and a second adjustment signal that are required to be provided in a working phase.

Referring to Table 1 below, the Table 1 is the first example of adjustment.

| Valid time of calibration clock CLK | 1 | 2 | 3 | 4 | 5 | 6 | Illustration |
|---|---|---|---|---|---|---|---|
| First adjustment signal T1 | A5 | A4 | A3 | A2 | A1 | A0 | The larger the number after A is, the larger the first adjustment signal |
| Second adjustment signal T2 | A0 | A1 | A2 | A3 | A4 | A5 | |
| Output signal | 0 | 0 | 0 | 1 | 1 | 1 | T1 or the second adjustment signal T2 is |
| Result | The time point at which a signal inversion of the output signal occurs is between 3-4 Either 3 or 4 may be taken as the first time point t1 | | | | | | |

The first adjustment signal A3 or A2 and the second adjustment signal A2 or A3 that correspond to the first time point t1 are taken as the first adjustment signal and the second adjustment signal that are required to be provided in the working phase.

In some embodiments, the step 401 may also be set as the following steps. The first adjustment signal is initially set to the minimum value and the second adjustment signal is initially set to the maximum value. The first adjustment signal is gradually increased and the second adjustment signal is gradually decreased. An output signal corresponding to different first adjustment signals and second adjustment signals is obtained.

At this time, the reference of the adjustment strategy is made to the following Table 2, which is the second example of adjustment.

| Valid time of calibration clock CLK | 1 | 2 | 3 | 4 | 5 | 6 | Illustration |
|---|---|---|---|---|---|---|---|
| First adjustment signal T1 | A0 | A1 | A2 | A3 | A4 | A5 | The larger the number after A is, the larger the first adjustment signal |
| Second adjustment signal T2 | A5 | A4 | A3 | A2 | A1 | A0 | |
| Output signal | 1 | 1 | 1 | 0 | 0 | 0 | T1 or the second adjustment signal T2 is |
| Result | The time point at which a signal inversion of the output signal occurs is between 3-4 Either 3 or 4 may be taken as the first time point t1 | | | | | | |

At this time, the first adjustment signal A3 or A2 and the second adjustment signal A2 or A3 that correspond to the first time node t1 are taken as the first adjustment signal and the second adjustment signal that are required to be provided in the working phase.

In some embodiments, referring to FIG. 9 continuously, the method for correcting mismatch further includes the following steps.

In Step 403, the first adjustment signal is initially set to the minimum value and the second adjustment signal is initially set to the maximum value, the first adjustment signal is gradually increased and the second adjustment signal is gradually decreased. An output signal corresponding to different first adjustment signals and second adjustment signals is obtained.

In Step 404, a first adjustment signal and a second adjustment signal that correspond to a second time point at which a potential inversion of an output signal occurs are obtained.

In Step 405, an average value of the first adjustment signals corresponding to the first time point and the second time point is taken as the first adjustment signal required to be provided in the working phase, and an average value of the second adjustment signals corresponding to the first time point and the second time point is taken as the second adjustment signal required to be provided in the working phase.

In some embodiments, after obtaining the first adjustment signal and the second adjustment signal that correspond to the first time point at which the potential inversion of the output signal occurs, the method further includes the following operations. The first adjustment signal is initially set to the minimum value and the second adjustment signal is initially set to a maximum value. The first adjustment signal is gradually increased and the second adjustment signal is gradually decreased. An output signal corresponding to different first adjustment signals and second adjustment signals is obtained. A first adjustment signal and a second adjustment signal that correspond to a second time point at which a potential inversion of an output signal occurs are obtained.

The operation of taking the first adjustment signal and the second adjustment signal that correspond to the first time point as the first adjustment signal and the second adjustment signal that are required to be provided in the working phase includes the following operations. An average value of the first adjustment signals corresponding to the first time point and the second time point is taken as the first adjustment signal required to be provided in the working phase. An average value of the second adjustment signals corresponding to the first time point and the second time point is taken as the second adjustment signal required to be provided in the working phase.

Referring to the Table 3 blow, the Table 3 is the third example of adjustment.

| Valid time of calibration clock CLK | 1 | 2 | 3 | 4 | 5 | 6 | Illustration |
|---|---|---|---|---|---|---|---|
| First adjustment signal T1 | A5 | A4 | A3 | A2 | A1 | A0 | The larger the number after A is, the larger the first adjustment signal T1 or the second adjustment signal T2 is |
| Second adjustment signal T2 | A0 | A1 | A2 | A3 | A4 | A5 | |
| Output signal | 0 | 0 | 0 | 0 | 1 | 1 | |
| First adjustment signal T1 | A0 | A1 | A2 | A3 | A4 | A5 | |
| Second adjustment signal T2 | A5 | A4 | A3 | A2 | A1 | A0 | |
| Output signal | 1 | 1 | 1 | 0 | 0 | 0 | |
| Result | | | | | | | The time point at which a signal inversion of the output signal occurs is between 4-5 Either 4 or 5 may be taken as the first time point t1 The time point at which a signal inversion of the output signal occurs is between 3-4 Either 3 or 4 may be taken as the second time point t2 |

At this time, the first adjustment signal T1 is the average value of A1 and A3, and the second adjustment signal T2 is the average value of A2 and A4.

It should be noted that the features disclosed in the method for correcting mismatch provided by the above embodiments may be combined arbitrarily under the condition of no conflict, and a new embodiment of the method for correcting mismatch may be obtained.

Yet another embodiment of the present disclosure provides a memory, which uses the comparator circuit provided in the above embodiment for data input, so as to eliminate the mismatch between two input transistors of a differential structure, thereby improving the memory performance.

In some embodiments, the memory is a Dynamic Random Access Memory (DRAM) chip. The memory of the DRAM chip conforms to the DDR2 memory specification.

In some embodiments, the memory is a DRAM chip. The memory of the DRAM chip conforms to the DDR3 memory specification.

In some embodiments, the memory is a DRAM chip. The memory of the DRAM chip conforms to the DDR4 memory specification.

In some embodiments, the memory is a DRAM chip. The memory of the DRAM chip conforms to the DDR5 memory specification.

Those skilled in the art can understand that the above-mentioned embodiments are specific embodiments for implementing the present disclosure. In practical applications, various changes in form and details may be made without departing from the spirit and the scope of the present disclosure.

Embodiments of the present disclosure provide a comparator circuit, a method for correcting mismatch, and a memory. The comparator circuit includes a first transistor, a second transistor, a load circuit, a first adjustment circuit and a second adjustment circuit. A terminal of the first transistor is coupled to a first node, another terminal of the first transistor is coupled to a first control node, and a gate of the first transistor is configured to receive a first control signal. A terminal of the second transistor is coupled to the first node, another terminal of the second transistor is coupled to a second control node, and a gate of the second transistor is configured to receive a second control signal. A transistor doping type of the first transistor is the same with a transistor doping type of the second transistor. A terminal of the load circuit is coupled to a second node, and another terminal of the load circuit is coupled to the first control node and the second control node. The load circuit is configured to adjust a level of the second control node based on a level of the first control node, or adjust the level of the first control node based on the level of the second control node. The adjusted node in the first control node and the second control node is configured to output an output signal. One of the first node and the second node is configured to receive a high level, and the other of the first node and the second node is configured to receive a low level. A terminal of the first adjustment circuit is coupled to the first node, and another terminal of the first adjustment circuit is coupled to the first control node. The first adjustment circuit is configured to adjust, according to a first adjustment signal, a node potential of the first control node, after the first transistor becomes conductive based on the first control signal. A terminal of the second adjustment circuit is coupled to the first node, and another terminal of the second adjustment circuit is coupled to the second control node. The second adjustment circuit is configured to adjust, according to a second adjustment signal, a node potential of the second control node, after the second transistor becomes conductive based on the second control signal. The first adjustment signal and the second adjustment signal are configured to adjust a mismatch between the first transistor and the second transistor. In the embodiments of the present disclosure, the first adjustment circuit is connected in parallel with the first transistor, and the first adjustment circuit can be conductive based on the first adjustment signal. After the first adjustment circuit becomes conductive, the first node is connected to the first control node through the first adjustment circuit, thus the potential of the first control node is adjusted. The second adjustment circuit is connected in parallel with the second transistor, and the second adjustment circuit can be conductive based on the second adjustment signal. After the second adjustment circuit becomes conductive, the first node is connected to the second control node through the second adjustment circuit, thus the potential of the second control node is adjusted. The first adjustment signal and the second adjustment signal are adjusted, which causes that when the first control signal is the same with the second control signal, the node potential of the first control node is the same with the node potential of the second control node. That is, the mismatch between the first transistor and the second transistor is corrected through the first adjustment circuit and the second adjustment circuit, thereby improving the memory performance.

What is claimed is:

1. A comparator circuit comprising:
   a first transistor, wherein a terminal of the first transistor is coupled to a first node, another terminal of the first transistor is coupled to a first control node, and a gate of the first transistor is configured to receive a first control signal;
   a second transistor, wherein a terminal of the second transistor is coupled to the first node, another terminal of the second transistor is coupled to a second control node, and a gate of the second transistor is configured to receive a second control signal;
   wherein a transistor doping type of the first transistor is the same with a transistor doping type of the second transistor;
   a load circuit, wherein a terminal of the load circuit is coupled to a second node, and another terminal of the load circuit is coupled to the first control node and the second control node, the load circuit is configured to adjust a level of the second control node based on a level of the first control node, or adjust the level of the first control node based on the level of the second control node, and the adjusted node in the first control node and the second control node is configured to output an output signal;
   wherein the first node is configured to receive a high level and the second node is configured to receive a low level, or the first node is configured to receive the low level and the second node is configured to receive the high level;
   a first adjustment circuit, wherein a terminal of the first adjustment circuit is coupled to the first node, another terminal of the first adjustment circuit is coupled to the first control node, and the first adjustment circuit is configured to adjust, according to a first adjustment signal, a node potential of the first control node, after the first transistor becomes conductive based on the first control signal; and
   a second adjustment circuit, wherein a terminal of the second adjustment circuit is coupled to the first node, another terminal of the second adjustment circuit is coupled to the second control node, and the second adjustment circuit is configured to adjust, according to a second adjustment signal, a node potential of the second control node, after the second transistor becomes conductive based on the second control signal;
   wherein the first adjustment signal and the second adjustment signal are configured to adjust a mismatch between the first transistor and the second transistor;
   wherein the comparator circuit further comprises:
   a calibration control circuit, wherein the calibration control circuit is configured to provide the first adjustment signal and the second adjustment signal;
   wherein the calibration control circuit comprises:
   a clock sub-circuit, configured to receive a calibration enable signal, and generate a calibration clock based on the calibration enable signal, wherein the calibration enable signal is provided in a calibration phase;
   a first calibration sub-circuit, wherein the first calibration sub-circuit is coupled to the clock sub-circuit, the first calibration sub-circuit initially sets the first adjustment signal to a maximum value and the second adjustment signal to a minimum value, provides the first adjustment signal and the second adjustment signal, and gradually decreases the first adjustment signal and increases the second adjustment signal based on the calibration clock;
   a judgment sub-circuit, configured to receive an output signal corresponding to different first adjustment signals and second adjustment signals, and obtain a first adjustment signal and a second adjustment signal corresponding to a first time point at which a potential inversion of the output signal occurs; and
   a storage sub-circuit, wherein the storage sub-circuit is coupled to the judgment sub-circuit, the storage sub-circuit is configured to obtain the first adjustment signal and the second adjustment signal corresponding to the first time point, and provide the first adjustment signal and the second adjustment signal corresponding to the first time point in a working phase.

2. The comparator circuit of claim 1, wherein,
   the first adjustment circuit comprises a first adjustment transistor, wherein a terminal of the first adjustment transistor is coupled to the first node, another terminal of the first adjustment transistor is coupled to the first control node, and a gate of the first adjustment transistor is configured to receive the first adjustment signal;
   the first adjustment transistor is configured to adjust a magnitude of a source-drain current based on the first adjustment signal;
   the second adjustment circuit comprises a second adjustment transistor, wherein a terminal of the second adjustment transistor is coupled to the first node, another terminal of the second adjustment transistor is coupled to the second control node, and a gate of the second adjustment transistor is configured to receive the second adjustment signal; and the second adjustment transistor is configured to adjust a magnitude of a source-drain current based on the second adjustment signal.

3. The comparator circuit of claim 1, wherein, the first adjustment circuit comprises a first adjustment transistor group, wherein the first adjustment transistor group comprises x first adjustment transistors;

wherein a terminal of each of the x first adjustment transistors is coupled to the first node, another terminal of each of the x first adjustment transistors is coupled to the first control node, and a gate of each of the x first adjustment transistors is configured to receive the first adjustment signal, and the first adjustment signal is configured to select to conduct the first adjustment transistors;

the second adjustment circuit comprises a second adjustment transistor group, wherein the second adjustment transistor group comprises x second adjustment transistors;

wherein a terminal of each of the x second adjustment transistors is coupled to the first node, another terminal of each of the x second adjustment transistors is coupled to the second control node, and a gate of each of the x second adjustment transistors is configured to receive the second adjustment signal, and the second adjustment signal is configured to select to conduct the second adjustment transistors;

wherein x is an integer greater than or equal to 2.

4. The comparator circuit of claim 3, wherein source-drain conduction capabilities of the x first adjustment transistors after being activated based on a same gate voltage are the same, and source-drain conduction capabilities of the x second adjustment transistors after being activated based on a same gate voltage are the same.

5. The comparator circuit of claim 3, wherein, among the x first adjustment transistors, after being activated based on a same gate voltage, a source-drain conduction capability of a nth first adjustment transistor is twice a source-drain conduction capability of a (n−1)th first adjustment transistor, and among the x second adjustment transistors, after being activated based on a same gate voltage, a source-drain conduction capability of a nth second adjustment transistor is twice a source-drain conduction capability of a (n−1)th second adjustment transistor, where n is any integer less than or equal to x and greater than or equal to 2.

6. The comparator circuit of claim 1, further comprising:

a switch MOS transistor, wherein a terminal of the switch MOS transistor is configured to couple a power supply node or a ground node, another terminal of the switch MOS transistor is coupled to the first node, and a gate of the switch MOS transistor is configured to receive a switch enable signal;

wherein the switch MOS transistor is coupled to the power supply node in response to the first node being configured to receive the high level, and the switch MOS transistor is coupled to the ground node in response to the first node being configured to receive the low level;

wherein a doping type of the switch MOS transistor is the same with a doping type of the first transistor.

7. The comparator circuit of claim 1, further comprising:

a first protection transistor, wherein a type of the first protection transistor is the same with a type of the first transistor, a terminal of the first protection transistor is coupled to the first node, another terminal of the first protection transistor is coupled to the first adjustment circuit, and a gate of the first protection transistor is configured to receive the first control signal; and a second protection transistor, wherein a type of the second protection transistor is the same with a type of the second transistor, a terminal of the second protection transistor is coupled to the first node, another terminal of the second protection transistor is coupled to the second adjustment circuit, and a gate of the second protection transistor is configured to receive the second control signal.

8. The comparator circuit of claim 1, wherein the load circuit comprises:

a third transistor, wherein a terminal of the third transistor is coupled to the second node, and another terminal of the third transistor is coupled to the first control node; and a fourth transistor, wherein a terminal of the fourth transistor is coupled to the second node, and another terminal of the fourth transistor is coupled to the second control node;

wherein a gate of the third transistor is coupled to a gate of the fourth transistor, and is coupled to the first control node;

wherein a transistor doping type of the third transistor is the same with a transistor doping type of the fourth transistor, and the transistor doping type of the first transistor is different from the transistor doping type of the third transistor.

9. The comparator circuit of claim 8, wherein the first node is configured to couple a power supply node, the second node is configured to couple a ground node, and the first transistor and the second transistor are P-type transistors, the third transistor and the fourth transistor are N-type transistors.

10. The comparator circuit of claim 1, wherein the calibration control circuit further comprises:

a second calibration sub-circuit, wherein the second calibration sub-circuit is coupled to the clock sub-circuit, the second calibration sub-circuit initially sets the first adjustment signal to a minimum value and the second adjustment signal to a maximum value, provides the first adjustment signal and the second adjustment signal, and gradually increases the first adjustment signal and decreases the second adjustment signal based on the calibration clock;

wherein the judgment sub-circuit is further configured to obtain a first adjustment signal and a second adjustment signal corresponding to a second time point at which a potential inversion of the output signal occurs;

wherein the storage sub-circuit is further configured to obtain a first adjustment signal and a second adjustment signal corresponding to a second time point, take an average value of first adjustment signals corresponding to the first time point and the second time point as the first adjustment signal required to be provided in the working phase, and take an average value of second adjustment signals corresponding to the first time point and the second time point as the second adjustment signal required to be provided in the working phase.

11. The comparator circuit of claim 1, further comprising:

a first selection circuit, configured to receive an input selection signal, and an input signal or a reference signal, and provide the first control signal; and a second selection circuit, configured to receive the input selection signal, and the input signal or the reference signal, and provide the second control signal;

wherein the first selection circuit is configured to select, based on the input selection signal, the input signal or the reference signal to provide the first control signal; and the second selection circuit is configured to select, based on the input selection signal, the input signal or the reference signal to provide the second control signal.

12. A method for correcting mismatch, applicable for the comparator circuit of claim 1, comprising:

controlling inputs of the first control signal and the second control signal to be the same during a calibration phase;

initially setting the first adjustment signal to a maximum value and the second adjustment signal to a minimum value;

gradually decreasing the first adjustment signal and increasing the second adjustment signal;

obtaining the output signal corresponding to different first adjustment signals and second adjustment signals;

obtaining a first adjustment signal and a second adjustment signal corresponding to a first time point at which a potential inversion of the output signal occurs; and taking the first adjustment signal and the second adjustment signal corresponding to the first time point as a first adjustment signal and a second adjustment signal that are required to be provided in a working phase.

13. The method for correcting mismatch of claim 12, wherein after obtaining the first adjustment signal and the second adjustment signal corresponding to the first time point at which the potential inversion of the output signal occurs, the method further comprises:

initially setting the first adjustment signal to the minimum value and the second adjustment signal to the maximum value;

gradually increasing the first adjustment signal and decreasing the second adjustment signal;

obtaining the output signal corresponding to different first adjustment signals and second adjustment signals; and obtaining a first adjustment signal and a second adjustment signal corresponding to a second time point at which a potential inversion of the output signal occurs, wherein taking the first adjustment signal and the second adjustment signal corresponding to the first time point as the first adjustment signal and the second adjustment signal that are required to be provided in the working phase comprises: taking an average value of first adjustment signals corresponding to the first time point and the second time point as the first adjustment signal required to be provided in the working phase; and taking an average value of second adjustment signals corresponding to the first time point and the second time point as the second adjustment signal required to be provided in the working phase.

14. A memory, comprising a comparator circuit, wherein the comparator circuit comprises:

a first transistor, wherein a terminal of the first transistor is coupled to a first node, another terminal of the first transistor is coupled to a first control node, and a gate of the first transistor is configured to receive a first control signal;

a second transistor, wherein a terminal of the second transistor is coupled to the first node, another terminal of the second transistor is coupled to a second control node, and a gate of the second transistor is configured to receive a second control signal;

wherein a transistor doping type of the first transistor is the same with a transistor doping type of the second transistor;

a load circuit, wherein a terminal of the load circuit is coupled to a second node, and another terminal of the load circuit is coupled to the first control node and the second control node, the load circuit is configured to adjust a level of the second control node based on a level of the first control node, or adjust the level of the first control node based on the level of the second control node, and the adjusted node in the first control node and the second control node is configured to output an output signal;

wherein the first node is configured to receive a high level and the second node is configured to receive a low level, or the first node is configured to receive the low level and the second node is configured to receive the high level;

a first adjustment circuit, wherein a terminal of the first adjustment circuit is coupled to the first node, another terminal of the first adjustment circuit is coupled to the first control node, and the first adjustment circuit is configured to adjust, according to a first adjustment signal, a node potential of the first control node, after the first transistor becomes conductive based on the first control signal; and a second adjustment circuit, wherein a terminal of the second adjustment circuit is coupled to the first node, another terminal of the second adjustment circuit is coupled to the second control node, and the second adjustment circuit is configured to adjust, according to a second adjustment signal, a node potential of the second control node, after the second transistor becomes conductive based on the second control signal;

wherein the first adjustment signal and the second adjustment signal are configured to adjust a mismatch between the first transistor and the second transistor;

wherein the comparator circuit further comprises:

a calibration control circuit, wherein the calibration control circuit is configured to provide the first adjustment signal and the second adjustment signal;

wherein the calibration control circuit comprises:

a clock sub-circuit, configured to receive a calibration enable signal, and generate a calibration clock based on the calibration enable signal, wherein the calibration enable signal is provided in a calibration phase;

a first calibration sub-circuit, wherein the first calibration sub-circuit is coupled to the clock sub-circuit, the first calibration sub-circuit initially sets the first adjustment signal to a maximum value and the second adjustment signal to a minimum value, provides the first adjustment signal and the second adjustment signal, and gradually decreases the first adjustment signal and increases the second adjustment signal based on the calibration clock;

a judgment sub-circuit, configured to receive an output signal corresponding to different first adjustment signals and second adjustment signals, and obtain a first adjustment signal and a second adjustment signal corresponding to a first time point at which a potential inversion of the output signal occurs; and a storage sub-circuit, wherein the storage sub-circuit is coupled to the judgment sub-circuit, the storage sub-circuit is configured to obtain the first adjustment signal and the second adjustment signal corresponding to the first time point, and provide the first adjustment signal and the second adjustment signal corresponding to the first time point in a working phase.

15. The memory of claim 14, wherein,
the first adjustment circuit comprises a first adjustment transistor, wherein a terminal of the first adjustment transistor is coupled to the first node, another terminal of the first adjustment transistor is coupled to the first control node, and a gate of the first adjustment transistor is configured to receive the first adjustment signal;
the first adjustment transistor is configured to adjust a magnitude of a source-drain current based on the first adjustment signal;
the second adjustment circuit comprises a second adjustment transistor, wherein a terminal of the second adjustment transistor is coupled to the first node, another terminal of the second adjustment transistor is coupled to the second control node, and a gate of the second adjustment transistor is configured to receive the second adjustment signal; and
the second adjustment transistor is configured to adjust a magnitude of a source-drain current based on the second adjustment signal.

16. The memory of claim 14, wherein,
the first adjustment circuit comprises a first adjustment transistor group, wherein the first adjustment transistor group comprises x first adjustment transistors;
wherein a terminal of each of the x first adjustment transistors is coupled to the first node, another terminal of each of the x first adjustment transistors is coupled to the first control node, and a gate of each of the x first adjustment transistors is configured to receive the first adjustment signal, and the first adjustment signal is configured to select to conduct the first adjustment transistors;
the second adjustment circuit comprises a second adjustment transistor group, wherein the second adjustment transistor group comprises x second adjustment transistors;
wherein a terminal of each of the x second adjustment transistors is coupled to the first node, another terminal of each of the x second adjustment transistors is coupled to the second control node, and a gate of each of the x second adjustment transistors is configured to receive the second adjustment signal, and the second adjustment signal is configured to select to conduct the second adjustment transistors;
wherein x is an integer greater than or equal to 2.

17. The memory of claim 16, wherein source-drain conduction capabilities of the x first adjustment transistors after being activated based on a same gate voltage are the same, and source-drain conduction capabilities of the x second adjustment transistors after being activated based on a same gate voltage are the same.

18. The memory of claim 16, wherein, among the x first adjustment transistors, after being activated based on a same gate voltage, a source-drain conduction capability of a nth first adjustment transistor is twice a source-drain conduction capability of a (n−1)th first adjustment transistor, and among the x second adjustment transistors, after being activated based on a same gate voltage, a source-drain conduction capability of a nth second adjustment transistor is twice a source-drain conduction capability of a (n−1)th second adjustment transistor, wherein n is any integer less than or equal to x and greater than or equal to 2.

* * * * *